(12) United States Patent
Powell et al.

(10) Patent No.: US 12,021,163 B2
(45) Date of Patent: Jun. 25, 2024

(54) PHOTOVOLTAIC DEVICES AND METHODS OF FORMING THE SAME

(71) Applicant: First Solar, Inc., Tempe, AZ (US)

(72) Inventors: Rick Powell, Ann Arbor, MI (US); Jongwoo Choi, Boise, ID (US)

(73) Assignee: First Solar, Inc., Tempe, AZ (US)

( * ) Notice: Subject to any disclaimer, the term of this patent is extended or adjusted under 35 U.S.C. 154(b) by 332 days.

(21) Appl. No.: 17/418,532

(22) PCT Filed: Dec. 23, 2019

(86) PCT No.: PCT/US2019/068307
§ 371 (c)(1),
(2) Date: Jun. 25, 2021

(87) PCT Pub. No.: WO2020/139826
PCT Pub. Date: Jul. 2, 2020

(65) Prior Publication Data
US 2022/0069151 A1    Mar. 3, 2022

Related U.S. Application Data

(60) Provisional application No. 62/785,465, filed on Dec. 27, 2018.

(51) Int. Cl.
*H01L 31/044* (2014.01)
*H01L 31/073* (2012.01)

(52) U.S. Cl.
CPC .................................. *H01L 31/073* (2013.01)

(58) Field of Classification Search
None
See application file for complete search history.

(56) References Cited

U.S. PATENT DOCUMENTS 6,208,005 B1    3/2001  Mitra
7,518,207 B1 *  4/2009  Chen .............. H01L 21/02609
                                                  257/E31.015

(Continued)

FOREIGN PATENT DOCUMENTS

| CN | 103681901 | 3/2014 |
| CN | 106653946 | 5/2017 |

(Continued)

OTHER PUBLICATIONS

International Search Report and Written Opinion, dated Mar. 5, 2020, Application No. PCT/US2019/068307.

(Continued)

*Primary Examiner* — Bach T Dinh
(74) *Attorney, Agent, or Firm* — MacMillan, Sobanski & Todd, LLC

(57) ABSTRACT

A photovoltaic device includes an electron blocking layer (EBL) and an absorber layer. The EBL is positioned between the absorber layer and a back contact layer. A material of the EBL is a cadmium zinc telluride $Cd_{(1-y)}Zn_{(y)}Te$, and a material of the absorber layer is a cadmium telluride selenide $CdTe_{(1-x)}Se_{(x)}$ producing a lattice mismatch between the materials of the EBL and between the materials of the absorber of less than about two tenths of a percent when x~y and has a value less than about 0.4.

16 Claims, 5 Drawing Sheets

(56) References Cited

U.S. PATENT DOCUMENTS

| | | |
|---|---|---|
| 7,858,872 B2 | 12/2010 | Hotz et al. |
| 8,093,094 B2 | 1/2012 | Stahle et al. |
| 8,912,037 B2 | 12/2014 | Johnson et al. |
| 9,231,134 B2 | 1/2016 | Foust et al. |
| 9,269,849 B2 | 2/2016 | Yu et al. |
| 9,496,446 B2 | 11/2016 | Cao et al. |
| 9,583,655 B2 | 2/2017 | Cheng |
| 9,871,154 B2 | 1/2018 | Duggal et al. |
| 10,062,800 B2 | 8/2018 | Blaydes et al. |
| 10,141,473 B1 | 11/2018 | Blaydes et al. |
| 10,243,092 B2 | 3/2019 | Damjanovic et al. |
| 10,367,110 B2 | 7/2019 | Jin et al. |
| 10,461,207 B2 | 10/2019 | Damjanovic |
| 10,529,883 B2 | 1/2020 | Damjanovic et al. |
| 10,784,397 B2 | 9/2020 | Blaydes et al. |
| 11,164,989 B2 | 11/2021 | Andreini et al. |
| 11,342,471 B2 | 5/2022 | Grover et al. |
| 11,367,805 B2 | 6/2022 | Los et al. |
| 11,588,069 B2 | 2/2023 | Andreini et al. |
| 11,695,085 B2 | 7/2023 | Jayamaha et al. |
| 11,769,844 B2 | 9/2023 | Damjanovic et al. |
| 11,784,278 B2 | 10/2023 | Andreini et al. |
| 11,817,516 B2 | 11/2023 | Damjanovic et al. |
| 11,843,070 B2 | 12/2023 | Abken et al. |
| 11,876,140 B2 | 1/2024 | Blaydes et al. |
| 2011/0139249 A1 | 6/2011 | Garnett et al. |
| 2011/0146744 A1 | 6/2011 | Korevaar et al. |
| 2011/0155208 A1 | 6/2011 | Wang |
| 2011/0247687 A1 | 10/2011 | Zhang et al. |
| 2011/0315220 A1 | 12/2011 | Korevaar et al. |
| 2012/0192923 A1 | 8/2012 | Korevaar et al. |
| 2013/0087190 A1* | 4/2013 | Han .................. H01L 31/06 136/258 |
| 2013/0098433 A1* | 4/2013 | Sankin ............ H01L 31/02966 438/57 |
| 2013/0104985 A1* | 5/2013 | Korevaar ............ H01L 31/0328 136/260 |
| 2013/0206219 A1 | 8/2013 | Kurtin et al. |
| 2014/0060608 A1 | 3/2014 | Choi et al. |
| 2014/0065763 A1 | 3/2014 | Foust et al. |
| 2014/0326315 A1 | 11/2014 | Blaydes et al. |
| 2014/0373908 A1* | 12/2014 | Duggal ................ H01L 31/073 136/260 |
| 2015/0207011 A1 | 7/2015 | Garnett et al. |
| 2017/0170353 A1 | 6/2017 | Jin et al. |
| 2018/0174761 A1 | 6/2018 | Kamino et al. |
| 2018/0233609 A1 | 8/2018 | Bishop et al. |
| 2019/0097079 A1 | 3/2019 | Blaydes et al. |
| 2019/0229226 A1 | 7/2019 | Wang |
| 2019/0296174 A1 | 9/2019 | Gloeckler et al. |
| 2019/0363214 A1 | 11/2019 | Los et al. |
| 2020/0035844 A1 | 1/2020 | Grover et al. |
| 2020/0403109 A1 | 12/2020 | Chen et al. |
| 2021/0288204 A1 | 9/2021 | Eaglesham et al. |

FOREIGN PATENT DOCUMENTS

| | | |
|---|---|---|
| EP | 2750200 | 7/2014 |
| WO | 2013043809 | 3/2013 |
| WO | 2014026099 | 2/2014 |
| WO | 2014197143 | 12/2014 |
| WO | 2017081477 | 5/2017 |
| WO | 2018013641 | 1/2018 |
| WO | 2018234878 | 12/2018 |
| WO | 2019048839 | 3/2019 |

OTHER PUBLICATIONS

Tanaka et al., "Zinc and Selenium Co-Doped CdTe Substrates Lattice Matched to HgCdTe", Journal of Crystal Growth, Jan. 1989, vol. 94, Issue 1, pp. 166-170.

Wei et al., "First-principles calculation of band offsets, optical bowings, and defects in CdS, CdSe, CdTe, and their alloys", American Institute of Applied Physics, Journal of Applied Physics, Feb. 2000, vol. 87, No. 3, pp. 1304-1311.

Corregidor et al., "Correlation of resistivity with zinc content in a vapor grown (Cd,Zn)Te:Se", American Institute of Physics, Applied Physics Letters, Dec. 2002, vol. 81, No. 27, pp. 5153-5155.

Muthukumarasamy et al., "Photoconductive Properties of Hot Wall Deposited CdSe0.7Te0.3 Thin Films", Journal of New Materials for Electrochemical Systems, Feb. 2007, vol. 10, pp. 39-42.

* cited by examiner

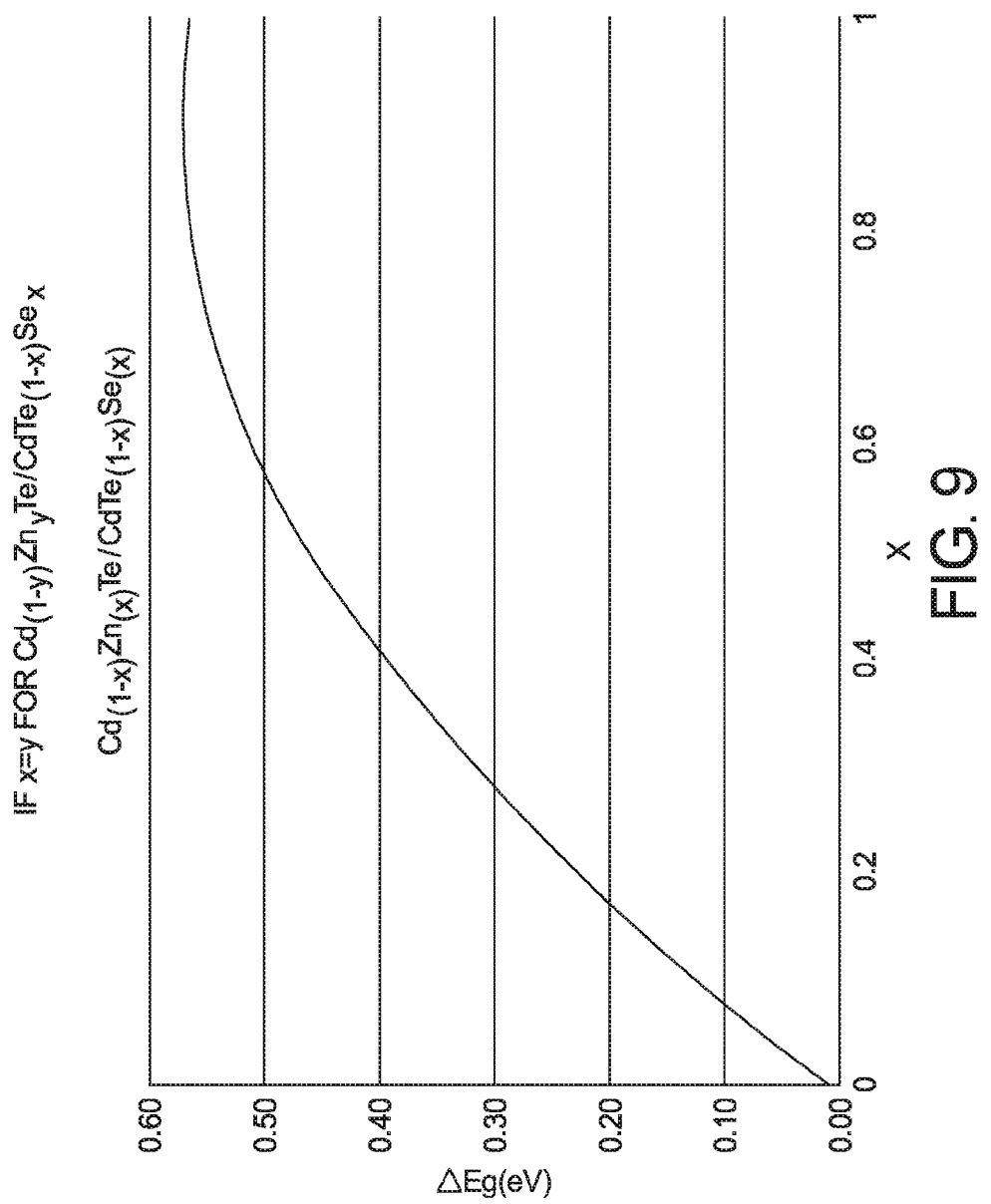

PHOTOVOLTAIC DEVICES AND METHODS OF FORMING THE SAME

CROSS-REFERENCE TO RELATED APPLICATIONS

This application claims priority from U.S. Provisional Patent Application No. 62/785,465, filed Dec. 27, 2018, incorporated by reference herein in its entirety.

BACKGROUND

The present specification generally relates to thin-film photovoltaic devices and, more specifically, to the structure of layers and use of particular combinations of polycrystalline materials to improve the efficiency of photovoltaic devices. Disclosed embodiments include photovoltaic devices having layer compositions of selected ternary or quaternary semiconductor materials, providing substantial lattice matching between adjacent layers.

The efficient operation of a photovoltaic device may be negatively affected by resistance losses, scattering, and recombination of mobile charge carriers. To improve the flow of electrical current in a photovoltaic device, a technique called electron blocking or electron reflection may be used. However, in practice, the benefit of an EBL layer is limited because the interface between the material of an absorber layer and the EBL, leads to high interface defects and interface recombination.

Thus, there is a need for layer structures, compositions, and methods to improve photovoltaic device efficiency.

SUMMARY

Semiconductor compositions, layer structures, and methods for use in photovoltaic devices are provided herein. The features provided by the embodiments described herein will be more fully understood in view of the following detailed description, in conjunction with the drawings.

DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

FIG. 9 depicts a graph of band gap difference between adjacent layers comprising $Cd_{(1-y)}Zn_{(y)}Te$ and $CdTe_{(1-x)}Se_{(x)}$, for varying values of x, where x=y.

DETAILED DESCRIPTION

Figure 1:
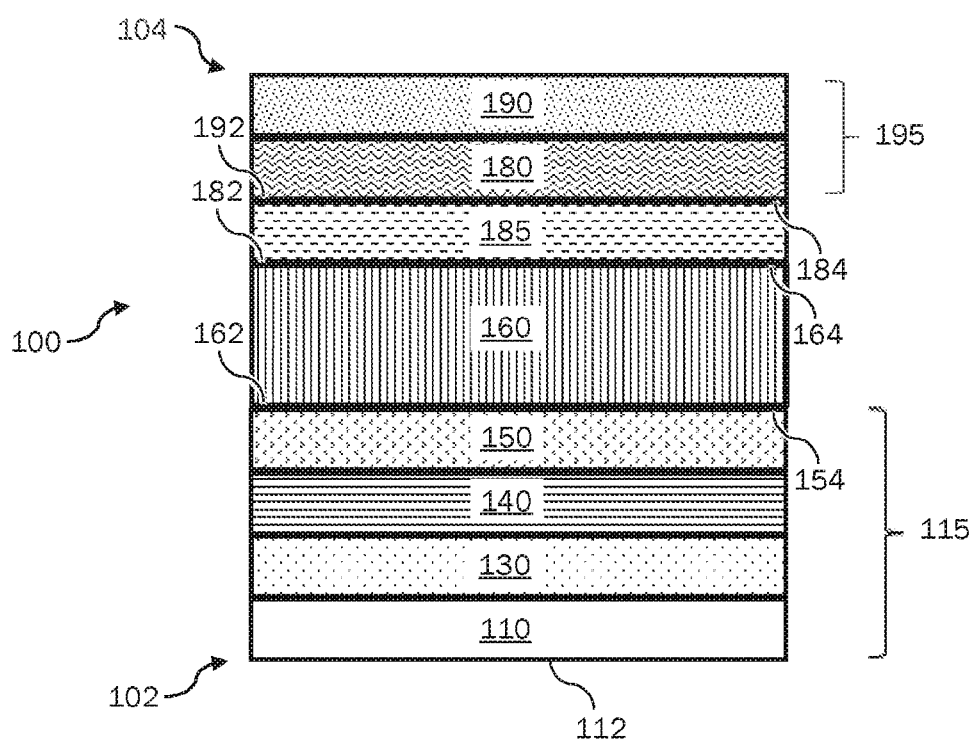
FIG. 1 depicts a schematic of functional layers in a photovoltaic device.

Example embodiments will now be described more fully with reference to the accompanying drawings.

A photovoltaic device generates electrical power by converting light into electricity using semiconductor materials that exhibit the photovoltaic effect. To generate power from sunlight, the active area of a photovoltaic device generally includes a bi-layer of two distinct regions, one above the other and each containing one or more materials, where each material may further contain added impurities. The result is that one region in the photovoltaic device is n-type, having an excess of negatively charged electrons, while the other is p-type, having an excess of positively charged holes. Where these two regions are adjacent, a p-n junction is formed.

When photons create free electrons and holes, collectively called charge carriers, near the p-n junction, the internal electric field of the junction causes the electrons to move towards the n-side of the junction and the holes towards the p-side thereby generating an electrical charge potential. A front contact comprising, or electrically connected to, the n-type layer, and a back contact, electrically connected to the absorber layer can provide pathways through which the electrical charge potential can flow to become an electrical current. Electrons can flow back to the p-side via an external current path, or circuit.

The efficient operation of a photovoltaic device may be detrimentally affected by resistance losses, scattering, and recombination of mobile charge carriers. To improve the flow of electrical current in a photovoltaic device, a technique called electron blocking or electron reflection may be used. An electron blocking layer (EBL) reduces charge loss between the absorber layer and the back current pathway by reducing the recombination of electron-hole pairs at the surface of the absorber layer closest to the back current pathway. It is noted that the term "electron blocking layer" or "EBL" is used to denote a semiconductor layer that interfaces with an absorber layer and having a band gap that is greater than the absorber layer such as, for example, at least about 0.1 eV greater than the absorber layer. Electron reflection can be practically applied, for example, by the addition of an EBL material between the absorber layer and the back current pathway. The EBL composition is selected in conjunction with the adjacent layers.

A selected material may function as a conduction-band energy barrier, suitable for use as an EBL, when used with compatible absorber and back contact materials, but not provide efficiency improvement with other absorber materials and back contacts. The EBL provides a conduction-band energy barrier at the junction between the absorber layer and the metal back conductor to increase open circuit voltage (Voc). This Voc increase improves cell efficiency if certain conditions are satisfied, which include having band alignment between the absorber layer and the EBL, and providing an appropriate absorber thickness.

However, in practice, the benefit of an EBL layer is limited because an abrupt interface between the absorber layer the EBL leads to high interface defects and interface recombination. If the lattice band match between two layers is large, the likelihood of interface defect density increases, thereby creating high interface recombination, which reduces the benefit of the conduction band offset of the EBL By selecting compositions and controlling lattice matching between adjacent polycrystalline material layers, disclosed embodiments may be used to increase device efficiency. A photovoltaic device according to the disclosed embodiments can include electron reflector layers and absorber layers providing an ohmic contact with lattice matching to achieve high performance efficiency at the interface between the absorber layer and the back current pathway.

When a lattice mismatch occurs at a junction between adjacent materials in a material stack, defect states are created which contribute to premature capture of electrons. A cadmium-zinc-telluride material can be used as an EBL to reduce lattice mismatch when used with a cadmium-telluride-selenium absorber layer. By specifically selecting the fractional amounts of the various materials, Voc increases, and lattice mismatch is controlled. Specifically, modifying a fractional content of the cadmium versus the zinc together with use of telluride in the EBL, and controlling a fractional content of the telluride versus the selenium in conjunction with use of cadmium in the absorber layer, provides increased efficiency and tunes the structure to reduce lattice mismatch between the EBL and the absorber layer.

Each of the layers described in the following embodiments may be composed of more than one layer or film. As used herein, the term "layer" refers to a thickness of material provided upon a surface. Additionally, each layer can cover all or a portion of the device and/or all or a portion of the layer or material underlying the layer. For example, a "layer" can mean any amount of material that contacts all or a portion of a surface. During a process to form one of the layers, the created layer forms on an outer surface, typically a top surface, of a substrate or substrate structure. A substrate structure may include a base layer introduced into a deposition process and any other or additional layers that may have been deposited onto the base layer in a prior deposition process or processes. Layers may be deposited over the entirety of a substrate with certain portions of the material later removed through laser ablation, scribing, or other material-removal process.

Referring now to FIG. 1, an embodiment of a photovoltaic device 100 is schematically depicted. The photovoltaic device 100 is configured to receive light and absorb photons, transforming photons into electricity by the photovoltaic effect. The photovoltaic device 100 can include a plurality of layers disposed between the light-incident energy side 102 and the opposing side 104.

The photovoltaic device 100 has an absorber layer 160 between a plurality of layers making up a front layer stack 115 and a back layer stack 195. Light entering on the energy side 102 passes through the front layer stack 115.

In the embodiment shown in FIG. 1, the front layer stack 115 comprises a substrate 110, a barrier layer 130, a transparent conductive layer 140, and a buffer layer 150. Light passes through the front layer stack 115 to the absorber layer 160.

The absorber layer 160 is electrically connected to the back layer stack 195, which includes a back contact 180. An electron blocking layer (EBL) 185 is disposed between the absorber layer 160 and the back contact 180 layer. For example, in some embodiments, the EBL 185 can be adjacent to the absorber layer 160. The phrase "adjacent to," as used herein, means that two layers are disposed contiguously and without any intervening materials between at least a portion of the layers.

Referring still to FIG. 1, the substrate 110 can be disposed at the energy side 102 of the photovoltaic device 100 and facilitates the transmission of light into the photovoltaic device 100. Optionally, the substrate 110 can include a coating configured to interact with light or to improve durability of the substrate 110 such as, but not limited to, an antireflective coating, an anti-soiling coating, or a combination thereof.

The photovoltaic device 100 can include a barrier layer 130 configured to mitigate diffusion of contaminants (e.g., sodium) from the substrate 110, which could result in degradation or delamination. In some embodiments, the barrier layer 130 can be provided adjacent to the substrate 110. Generally, the barrier layer 130 can be substantially transparent, thermally stable, with a reduced number of pin holes, having high sodium-blocking capability, and good adhesive properties. Alternatively or additionally, the barrier layer 130 can be configured to apply color suppression to light. The barrier layer 130 can include one or more layers of suitable material, including, but not limited to, tin oxide, silicon dioxide, aluminum-doped silicon oxide, silicon oxide, silicon nitride, or aluminum oxide.

Referring still to FIG. 1, the photovoltaic device 100 can include a transparent conductive oxide (TCO) layer 140 configured as a front electrode to provide electrical contact to transport charge carriers generated by the photovoltaic device 100. In some embodiments, the TCO layer 140 can be provided adjacent to the barrier layer 130. Generally, the TCO layer 140 can be formed from one or more layers of n-type semiconductor material that is substantially transparent and has a wide band gap. Specifically, the wide band gap can have a larger energy value compared to the energy of the photons of the light, which can mitigate undesired absorption of light. The TCO layer 140 can include one or more layers of suitable material, including, but not limited to, tin dioxide, doped tin dioxide (e.g., $F:SnO_2$), indium tin oxide, or cadmium stannate ($Cd_2SnO_4$, or CTO).

The photovoltaic device 100 can include a buffer layer 150 configured to provide an insulating layer between the TCO layer 140 and any adjacent semiconductor layers. In some embodiments, the buffer layer 150 can be provided adjacent to the TCO layer 140. The buffer layer 150 may include material having higher resistivity than the TCO layer 140, including, but not limited to, intrinsic tin dioxide, zinc magnesium oxide (e.g., $Zn_{1-x}Mg_xO$), silicon dioxide ($SnO_2$), aluminum oxide ($Al_2O_3$), aluminum nitride (AlN), zinc tin oxide, zinc oxide, tin silicon oxide, or any combination thereof. In some embodiments, the material of the buffer layer 150 can be configured to have a band gap substantially greater than the band gawp of an adjacent semiconductor layer (e.g., an absorber).

A p-n junction can be formed by providing an absorber layer 160 sufficiently close to a portion of the photovoltaic device 100 having an excess of negative charge carriers, i.e., electrons or donors. In some embodiments, the absorber layer 160 can be provided adjacent to an n-type semiconductor material. Alternatively, one or more intervening layers can be provided between the absorber layer 160 and n-type semiconductor material, in some embodiments, the absorber layer 160 can be provided adjacent to a window layer. In embodiments having a window layer, the window layer can be a doped or undoped n-type material, including, for example, cadmium sulfide, zinc sulfide, cadmium zinc sulfide, zinc magnesium oxide, or combinations thereof. In some embodiments, as shown in FIG. 1, the absorber layer 160 can be provided adjacent to the buffer layer 150 with the TCO layer 140, adjacent to the buffer layer 150, providing the n-type semiconductor for the p-n junction and omitting a window layer.

The absorber layer 160 is configured to cooperate with a layer of the front layer stack 115 and form a p-n junction within the photovoltaic device 100. Accordingly, absorbed photons of the light can free electron-hole pairs and generate carrier flow, which can yield electrical power. The absorber layer 160 can have a first surface 162 substantially facing the energy side 102 of the photovoltaic device 100 and a second surface 164 substantially facing the opposing side 104 of the photovoltaic device 100. The first surface 162 of the absorber layer 160 is adjacent to a front stack back surface 154 of the front layer stack 115. A thickness of the absorber layer 160 can be defined between the first surface 162 and the second surface 164. The thickness of the absorber layer 160 can be between about 0.5 µm to about 10 µm such as, for example, between about 1 µm to about 7 µm in one embodiment, or between about 2 µm to about 5 µm in another embodiment.

According to the embodiments described herein, the absorber layer 160 can be formed from a p-type semiconductor material having an excess of positive charge carriers, i.e., holes or acceptors. The absorber layer 160 can comprise p-type semiconductor materials such as group II-VI semiconductors. Specific examples include, but are not limited to, semiconductor materials comprising cadmium, tellurium, selenium, or any combination thereof. Suitable examples include, but are not limited to, a ternary compound of cadmium, tellurium, and selenium, (e.g., $CdTe_{1-x}Se_x$), a quaternary compound of cadmium, zinc, tellurium and selenium, (e.g., $Cd_{1-y}Zn_yTe_{1-x}Se_x$), or a compound comprising cadmium, tellurium, selenium, and one or more additional elements.

In some embodiments, an atomic concentration of the elements in the absorber layer 160 may vary across a thickness of the absorber layer. The concentration may form a gradient across a layer thickness. Alternatively or additionally, the concentration profile of the elements can vary through the thickness of the absorber layer 160 between a first or front surface 162 and a back or second surface 164 of the absorber layer 160. In some embodiments, the atomic concentration can vary with distance from the second surface 164 of the absorber layer 160. For example, the mole ratio of $CdTe_{1-x}Se_x$ of the absorber layer measured in bulk can be provided such that x is less than about 0.4 such as, for example, a range of about 0.1 to about 0.4. Alternatively or additionally, the mole ratio of $CdTe_{1-x}Se_x$ measured along any portion of the thickness of the absorber layer can be provided such that x is less than about 0.4 such as, for example, a range of about 0.01 to about 0.4. Generally, as used herein, reference to a mole ratio of a layer, e.g., "EBL has a mole ratio," is intended to invoke the bulk measurement of the layer. Alternatively, reference to a specific location of the layer, e.g., "second surface of the absorber layer has a mole ratio," is intended to refer to the mole ratio of the referenced location.

The photovoltaic device 100 can include a back contact layer 180 configured to mitigate undesired alteration or migration of a dopant and to provide electrical contact to the absorber layer 160. In some embodiments, the back contact layer 180 can include binary or ternary combinations of materials from groups I, II, VI, such as for example, one or more layers containing zinc, copper, cadmium and tellurium in various compositions. Further exemplary materials include, but are not limited to, zinc telluride doped with a dopant (e.g., copper telluride), or zinc telluride alloyed with copper telluride. The thickness of the back contact layer 180 can be between about 5 nm to about 200 nm such as, for example, between about 10 nm to about 50 nm in one embodiment.

As shown in FIG. 1, an electron blocking layer (EBL) 185 may be disposed between, and in direct contact with, the back contact layer 180 and the absorber layer 160. An interface surface 182 is located at the junction of the electron blocking layer 185 and the absorber layer 160.

The back layer stack 195 includes one or more conductive layers. For example, in the embodiment shown in FIG. 1, the back layer stack 195 includes the back contact layer 180 and a conducting layer 190, configured to provide electrical contact with the absorber layer 160. As shown in FIG. 1, in some embodiments, the back stack front surface 192 of the back layer stack 195 is adjacent to an EBL back surface 184. In some embodiments, a thin oxide layer may be formed as a part of the back stack front surface 192 in contact with the EBL back surface 184. In some embodiments the thin oxide layer of the back stack front surface 192 has a thickness of about 5-15 angstroms, or between about 1-20 angstroms. In some embodiments, the thin oxide layer is a substantially contiguous monolayer. In some embodiments, the conducting layer 190 can be provided adjacent to the back contact layer 180. The conducting layer 190 can include a suitable conducting material such as, for example, one or more layers of nitrogen-containing metal, silver, nickel, copper, aluminum, titanium, palladium, chrome, molybdenum, gold, or the like. Suitable examples of a nitrogen-containing metal layer can include molybdenum nitride, nickel nitride, titanium nitride, tungsten nitride, selenium nitride, tantalum nitride, zirconium nitride, or vanadium nitride.

The photovoltaic device 100 may further include a back support, an encapsulation layer, and/or a housing for the photovoltaic device 100. Photovoltaic devices 100 may further include electrical connections, not shown, that provide a current path to communicate generated current flow, such as from one photovoltaic cell to adjacent cells in a module or from one photovoltaic module to adjacent modules in an array. Alternatively, the electrical connections may communicate the current flow to an external load device where the photogenerated current provides power.

Figure 2:
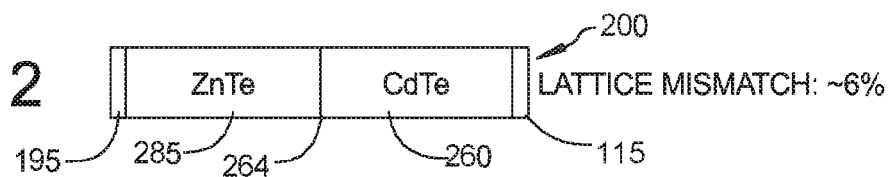
FIG. 2 depicts a schematic of functional layers in a first embodiment of a photovoltaic device.

Referring to FIG. 2, a photovoltaic device 200 may include an electron blocking layer (EBL) 285 of a zinc telluride (ZnTe) material positioned adjacent to the back layer stack 195, with an absorber layer 260 of a cadmium telluride (CdTe) material positioned adjacent to the front layer stack 115. This combination of layers produces a lattice mismatch of approximately 6% at the interface 264 between an electron blocking layer (EBL) 285, consisting essentially of ZnTe, and an absorber layer 260, consisting essentially of CdTe. This corresponds to the level of mismatch in prior art devices and the abrupt interface between absorber and EBL, leads to high interface defect states due to the lattice mismatch.

Figure 3:
FIG. 3 depicts a schematic of functional layers in a second embodiment of a photovoltaic device.

Referring to FIG. 3, a photovoltaic device 300 may include an electron blocking layer (FBI) 385 of a zinc telluride (ZriTe) material positioned adjacent to the back layer stack 195, with an absorber layer 360 of a cadmium telluride selenide (CdTeSe) material having a composition $CdTe_{0.7}Se_{0.3}$, positioned adjacent to the front layer stack 115. This combination of layers produces a lattice mismatch of approximately 4% at the interface 364 between the ZnTe and CdTeSe.

Figure 4:
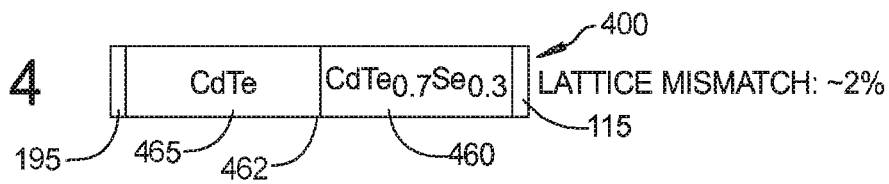
FIG. 4 depicts a schematic of functional layers in a third embodiment of a photovoltaic device.

Referring to FIG. 4, a photovoltaic device 400 may include a semiconducting layer 465 of a cadmium telluride (CdTe) material, positioned adjacent to the back layer stack 195, and adjacent to an absorber layer 460 of a cadmium telluride selenide ($CdTe_{0.7}Se_{0.3}$) material positioned adjacent to the front layer stack 115. This combination of layers produces a lattice mismatch of approximately 2% at the interface 462 between CdTe and CdTeSe.

Figure 5:
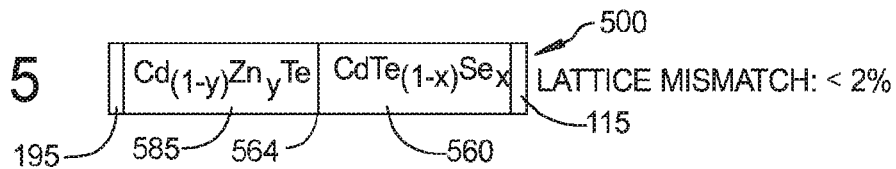
FIG. 5 depicts a schematic of functional layers in a fourth embodiment of a photovoltaic device.

Referring to FIG. 5, according to embodiments of the present invention, a photovoltaic device 500 is shown. The photovoltaic device includes a back layer stack 195, an absorber layer 560 formed from $CdTe_{(1-x)}Se_{(x)}$, and an electron blocking layer (EBL) 585 formed from $Cd_{(1-y)}Zn_{(y)}Te$ disposed therebetween. The absorber layer 560 is disposed adjacent to a front layer stack 115. The absorber layer 560 and the EBL 585 are in direct contact at an interface 564. The EBL 585 comprises a first polycrystalline material with a first plurality of grains having a zinc-blende structure. The absorber layer 560 comprises a second polycrystalline material with a second plurality of grains having a zinc-blende structure. In some embodiments, the device has substantial alignment or local epitaxy between the first plurality of grains and the second plurality of grains at the interface 564. Alignment of a substantial subset of grains at the interface may be accomplished during a deposition step or during a subsequent annealing step.

According to embodiments of the present disclosure, the value of x is approximately equal to the value of y at the interface 564 such as, for example, a magnitude of a difference between x and y can be less than about 0.005, providing both substantial lattice match and band alignment. The combination of layers and materials produces a lattice mismatch between the EBL and the absorber layer of <0.2%, if x=y<0.4. In some embodiments, the value of x and y is less than about 0.4 at the interface 564 such as, for example, between about 0.1 and about 0.4 in one embodiment. In some embodiments, the value of x and y is less than about 0.3 at the interface 564 such as, for example, between about 0.2 and about 0.3 in one embodiment. In some embodiments the value of x is substantially constant through a thickness of the absorber layer 560 and the value of y is substantially constant through a thickness of the electron blocking layer 585.

In some embodiments, the value of x and/or y varies across a layer thickness. For example, in some embodiments, the value of x and y at the interface 564 can such that x and y are less than about 0.4 such as for example, a range of between about 0.005 to about 0.4 in one embodiment, between about 0.1 to about 0.4 in another embodiment, or between about 0.2 to about 0.3 in a further embodiment. The value of x can gradually increase towards the front through a thickness of the absorber layer 560, such that the atomic percentage of selenium is higher adjacent the front layer stack 115. In some embodiments the value of y gradually increases toward the back through a thickness of the electron blocking layer 585, such that the atomic percentage of zinc is higher adjacent the back layer stack 195.

Figure 6:
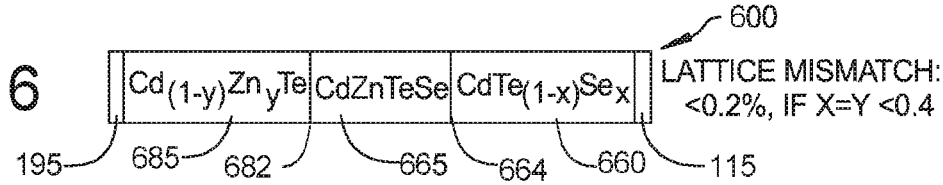
FIG. 6 depicts a schematic of functional layers in a fifth embodiment of a photovoltaic device.

Referring to FIG. 6, according to embodiments of the present disclosure, a photovoltaic device 600 is shown. The photovoltaic device includes a back layer stack 195, an electron blocking layer (EBL) 685 formed from $Cd_{1-y}Zn_{(y)}Te$ adjacent to the back layer stack 195, an absorber layer 660 formed from $CdTe_{1-x}Se_{(x)}$, in contact with a front layer stack 115, and a transition layer 665 between and contacting the absorber layer 660 and the electron blocking layer (EBL) 685. A transition layer 665 may include a quaternary alloy of cadmium zinc selenide telluride (CdZnTeSe), having a formula $Cd_{(1-y)}Zn_{(y)}Te_{(1-x)}Se_{(x)}$, formed between the absorber layer 660 and the EBL 685. The combination of layers and materials produces a lattice mismatch between the EBL and the absorber layer of less than about 0.2%, for a device in which, the value of x is approximately equal to the value of y (e.g., a magnitude of a difference between x and y can be less than about 0.005), and where the value of x and y is less than about 0.4 (e.g., in a range between about 0.1 to about 0.4) in the transition layer 665, at an absorber interface 664, and at an EBL interface 682.

According to embodiments of the disclosure, the value of x is approximately equal to the value of y at the absorber interface 664 contacting a first side of the transition layer 665 and at the EBL interface 682, contacting a second side of the transition layer 665, thus providing both substantial lattice match and band alignment. The combination of layers and materials produces a lattice mismatch between the EBL and the absorber layer of < about 0.2%, if x=y<0.4. In some embodiments, the value of x and y can be less than about 0.4 such as, for example, a range of about 0.1 to about 0.4, or about 0.2 to about 0.3, at the absorber interface 664 and at the EBL interface 682. In some embodiments the value of x is substantially constant through a thickness of the absorber layer 660 and the value of y is substantially constant through a thickness of the electron blocking layer 685. In some embodiments, the value of x and y is substantially constant and equal across a thickness of the transition layer 665 and the thickness of the transition layer 665 is in a range from about 0.5 to 150 nm. In some of these embodiments, the transition layer 665 has a thickness in a range of 15 to 50 nanometers.

The transition layer 665 may be a quaternary alloy formed on one of the EBL 685 and/or the absorber layer 660 using methods such as vapor deposition and the like. Alternatively, the transition layer 665 may be formed during the formation of the device 600 such as, for example, during an annealing step or another step causing the alloying of the adjacent EBl. 685 and absorber layer 660. Diffusion of Se and/or Te on the anion sub-lattice is slower than diffusion of Zn and or Cd. In an embodiment, diffusion of Se and/or Te into a transition layer is performed at a temperature in a range of about 400° C. to about 1200° C. In an embodiment, diffusion of Se and/or Te into a transition layer is performed during grain growth and recrystallization using a growth flux, such as $CdCl_2$. In an embodiment, composition gradients of Se and Te in a transition layer are formed prior to forming composition gradients of Zn and Cd. In an embodiment, diffusion of Zn and/or Cd into a transition layer is performed at a temperature in a range of about 250° C. about 450° C. The transition layer may be doped or undoped and may substantially constant or compositionally graded across the thickness of the layer.

Figure 7:
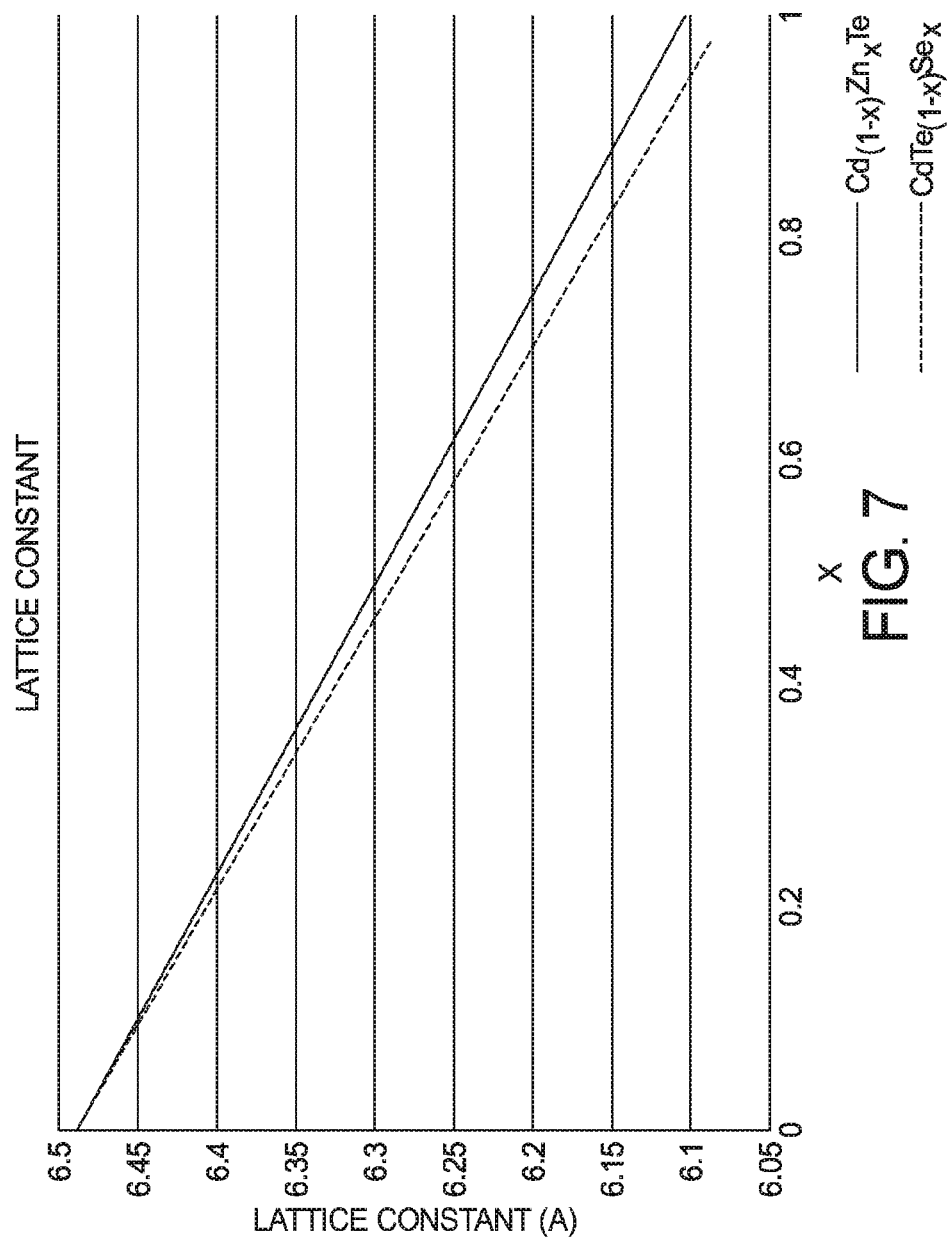
FIG. 7 depicts a graph of lattice constants for different material fractions used in a photovoltaic device of the present disclosure.

Referring to FIG. 7, a graph is shown of lattice constants over a range of values for selected ternary compositions. The graph shows lattice constants on the y-axis for cadmium zinc telluride, shown with a solid line, and cadmium telluride selenide, shown with a dashed line, with varying atomic concentrations shown on the x-axis. The graph shows that the lattice constant is nearly identical for the two ternary alloys when the atomic concentration of zinc in the cadmium zinc telluride is equal to the atomic concentration of selenium in the cadmium telluride selenide. The data also shows a linear relationship between lattice constant and atomic concentration as the concentration of Zn and Se, in CdZnTe and CdTeSe, respectively, increases from zero to one.

Figure 8:
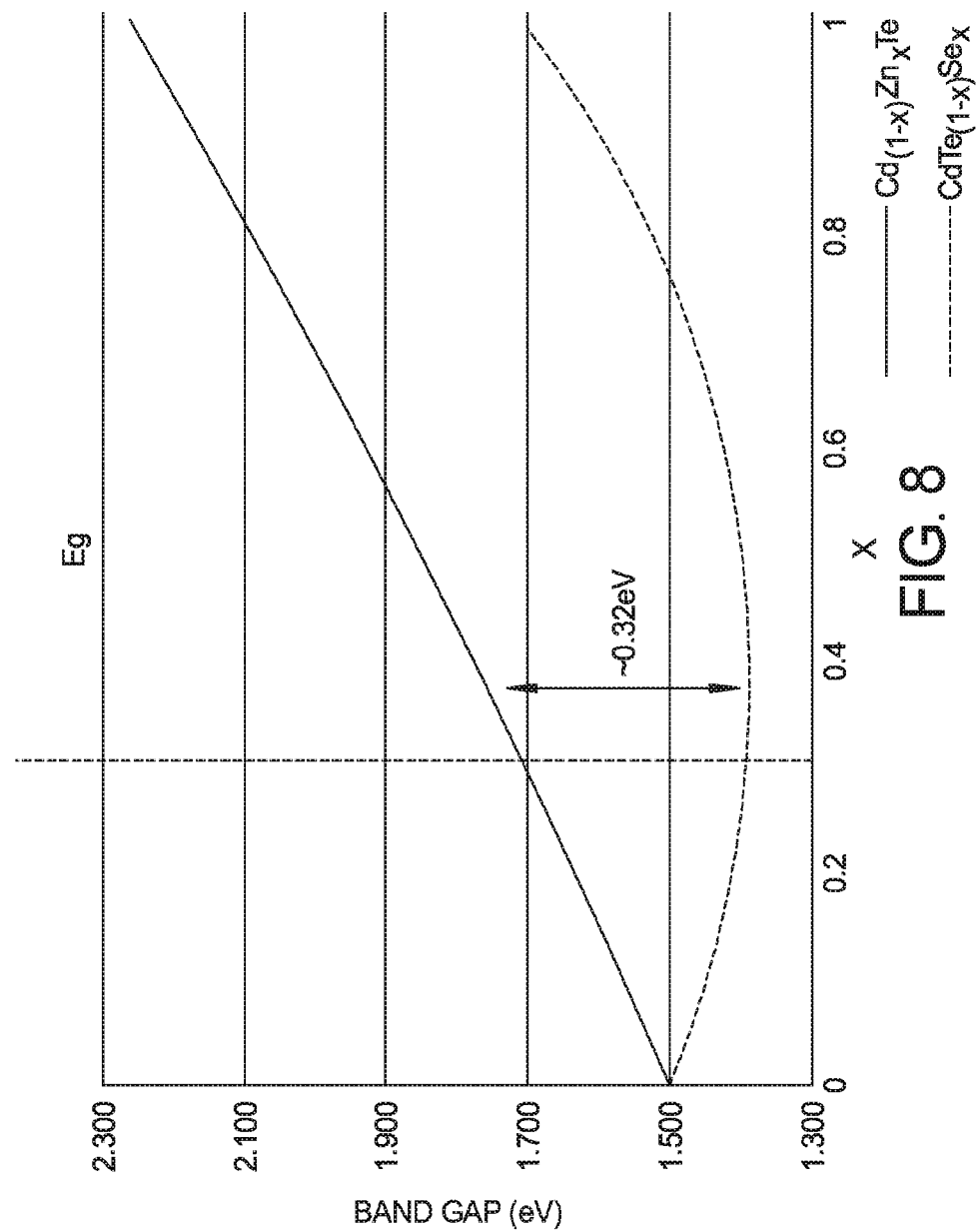
FIG. 8 depicts a graph of band gap voltages for different material fractions used in a photovoltaic device of the present disclosure.

Referring to FIG. 8, the band gap of ternary compositions of cadmium zinc telluride (CdZnTe) and cadmium telluride selenide (CdTeSe) is shown for compounds with varying atomic concentrations of Zn and Se, respectively. The band gap of cadmium zinc telluride (CdZnTe) is shown with a solid line and the band gap of cadmium telluride selenide (CdTeSe) is shown with a dashed curve.

Comparing FIG. 7 and FIG. 8, shows that band gap is not a linear function of the lattice parameter for compositions of $CdTe_{(1-x)}Se_{(x)}$. Although lattice constant is smallest for compositions of $Cd_{(1-y)}Zn_{(y)}Te$ and $CdTe_{(1-x)}Se_{(x)}$, wherein the value of x and y equals or approaches 1 (ZnTe and CdSe), the bandgap difference is greater than for lower values of x and y. An example of a relatively small lattice mismatch and corresponding significant band gap difference is shown, with x=0.3 where the dashed vertical line indicates in FIG. 8.

FIG. 9 shows difference in band gap on the y-axis for compositions of cadmium zinc telluride and cadmium telluride selenide with co-varying atomic concentrations of Zn and Se shown on the x-axis. A band gap difference between $Cd_{(1-y)}Zn_{(y)}Te$ and $CdTe_{(1-x)}Se_{(x)}$, where v=x, is about 0.32 eV, when the value of "x" is approximately 0.3. The efficiency gain due to use of the EBL is saturated when the conduction band offset is approximately 0.3 eV, thus, providing a larger conduction band offset does not provide extra benefit in efficiency gain.

Devices with increased efficiency are provided by designing layer structures with respect to both lattice constant and band gap for a photovoltaic device using a $Cd_{(1-y)}Zn_{(y)}Te$ material for the EBL and $CdTe_{(1-x)}Se_{(x)}$ material for the absorber, wherein variable "y" is approximately equal to variable "x." In some embodiments, an efficient device is achieved with a value for "y" in a range of approximately 0.2 to 0.4 for the EBL material $Cd_{(1-y)}Zn_{(y)}Te$ and a range of approximately 0.2 to 0.4 for the variable "x" for the absorber material $CdTe_{(1-x)}Se_{(x)}$. For example, an EBL material $Cd_{(0.7)}Zn_{(0.3)}Te$ has a 70 atomic percent concentration of Cd, and a 30 atomic percent concentration of Zn, compared to Te; and the absorber material $CdTe_{(0.7)}Se_{(0.3)}$ has a 70 atomic percent concentration of Te and a 30 atomic percent concentration of Se, compared to Cd. In some embodiments, a value of x and y is in a range of about 0.2 to about 0.3 at the interface.

In some embodiments, in order to satisfy both criteria of lattice mismatch and band alignment for CdTe-based photovoltaic devices, a photovoltaic device includes an electron blocking layer (EBL) and an absorber layer positioned in direct contact with the EBL. The EBL comprises a first polycrystalline material with a first plurality of grains having a zinc-blende structure. The absorber layer comprises a second polycrystalline material with a second plurality of grains having a zinc-blende structure. In some embodiments, the device has substantial alignment or local epitaxy between the first plurality of grains and the second plurality of grains. In some embodiments, a material of the EBL is a cadmium zinc telluride, and a material of the absorber layer is a cadmium telluride selenide.

In some embodiments, a photovoltaic device includes an electron blocking layer (EBL) and an absorber layer positioned adjacent to the EBL. A material of the EBL is a cadmium zinc telluride $Cd_{(1-y)}Zn_{(y)}Te$, and a material of the absorber layer is a cadmium telluride selenide $CdTe_{(1-x)}Se_{(x)}$ producing a lattice mismatch between the EBL and absorber of <0.2%, when x=y<0.4 adjacent the absorber interface or adjacent the transition layer between the absorber and EBL.

In some embodiments, a method for constructing a photovoltaic device includes: positioning an electron blocking layer (EBL) adjacent to a back contact; depositing an absorber layer directly adjacent to the EBL; selecting a material of the EBL as a cadmium zinc telluride $Cd_{(1-y)}Zn_{(y)}Te$; selecting a material of the absorber layer as a cadmium telluride selenide $CdTe_{(1-x)}Se_{(x)}$; and controlling a lattice mismatch of the EBL and the absorber layer by selecting variables x=y<0.4.

According to the embodiments described herein, a layer structure for a photovoltaic device can include a front layer stack, wherein the front layer stack comprises a plurality of transparent layers, including a front contact layer; an absorber layer comprising cadmium, tellurium, and selenium, disposed on the front layer stack; a semiconductor layer disposed on the absorber layer; and a back contact layer disposed on the semiconducting layer, wherein the semiconductor layer is an electron blocking layer comprising cadmium, zinc, and tellurium; wherein the absorber layer is between the layer stack and the semiconductor layer; and wherein a lattice mismatch between the semiconductor layer relative to the absorber layer is between 0.0-1.0%. In some embodiments, a lattice mismatch between the semiconductor layer and the absorber layer is between 0.0-0.5%, or less than about 0.2%.

In some embodiments, an absorber layer comprises $CdTe_{(1-x)}Se_{(x)}$, and an electron blocking layer comprises $Cd_{(1-y)}Zn_{(y)}Te$, and the value of x is approximately equal to y at the interface. In some embodiments, the value of both x and y is between 0.1 and 0.4. In some embodiments, the value of both x and y is between about 0.2 to about 0.3.

In some embodiments, a device further comprises a transition layer between the absorber layer and the electron blocking layer. In some embodiments, the transition layer comprises a quaternary alloy. In some embodiments, the transition layer consists essentially of $Cd_{(1-y)}Zn_{(y)}Te_{(1-x)}Se_{(x)}$, and wherein the value of both x and y is between about 0.2 to about 0.3 and the value of x and y is substantially equal and constant across a thickness of the transition layer, having a thickness in a range between 0.5 to 150 nanometers. In some embodiments the thickness of the transition layer is between 15 to 50 nanometers.

In some embodiments, the value of x varies continuously across a thickness of the absorber layer with the lowest value of x adjacent the transition layer and the value of y varies continuously across a thickness of the EBL with the lowest value of y adjacent the transition layer. In some embodiments, a back contact comprises a ZnTe on the EBL. In some embodiments the back contact comprises a thin oxide layer adjacent to a conducting layer comprising a metal nitride layer, and the thin oxide layer contacts the second or back surface of the EBL.

According to embodiments described herein, an electron blocking layer comprises $Cd_{(1-y)}Zn_{(y)}Te$ compositionally graded across a thickness of a layer, wherein the value of y is greater adjacent the back contact, than adjacent the absorber layer. In some embodiments, y is in a range between 0.15 to 0.30 at a front side of the electron blocking layer and in a range of 0.25 to 0.65 at a back side of the electron blocking layer and the value of x increases across a thickness of the EBL, from the front to the back surface. In some embodiments, y is equal to about 0.15 at a front side of the electron blocking layer and about 0.3 at a back side of the electron blocking layer. In some embodiments, y is equal to about 0.2 at a front side of the electron blocking layer and about 0.4 at a back side of the electron blocking layer.

According to embodiments described herein, an absorber layer comprises $CdTe_{(1-x)}Se_{(x)}$, compositionally graded across a thickness of the absorber layer, wherein the value of x is greater adjacent the front layer stack than adjacent the electron blocking layer, in some embodiments, x is equal to about 0.4, at a front side of the absorber layer, and equal to about 0.1 at a back side of the absorber layer. In some embodiments, x is equal to about 0.3, at a front side of the absorber layer, and equal to about 0.15 at a back side of the absorber layer.

The terminology used herein is for the purpose of describing particular example embodiments only and is not intended to be limiting. It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed. Individual elements or features of a particular embodiment are generally not limited to that particular embodiment, but, where applicable, are interchangeable and can be used in a selected embodiment, even if not specifically shown or described.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A photovoltaic device, comprising:
   a front layer stack, wherein the front layer stack comprises a plurality of transparent layers;
   an absorber layer having a first surface disposed on the front layer stack and a second surface, the absorber layer comprising cadmium, tellurium, and selenium;
   an electron blocking layer having a first surface disposed on the second surface of the absorber layer and a second surface, the first surface of the electron blocking layer having a band gap that is at least 0.1 eV greater than a band gap of the second surface the absorber layer; and
   a back contact layer disposed on the second surface of the electron blocking layer;
   wherein:
   the electron blocking layer comprises cadmium, zinc, and tellurium; and
   a lattice mismatch between the electron blocking layer relative to the absorber layer is less than 4%
   wherein:
   the electron blocking layer has a mole ratio of $Cd_{(1-y)}Zn_{(y)}Te$, where y is in a range from 0.005 to 0.4;
   the absorber layer has a mole ratio of $CdTe_{(1-x)}Se_{(x)}$, where x is in a range from 0.005 to 0.4;
   the absorber layer is compositionally graded whereby a value of x is greater at the first surface than at the second surface of the absorber layer; and
   the electron blocking layer is compositionally graded, and the value of y is greater at the second surface than at the first surface of the electron blocking layer, and wherein the value of y at the first surface of the electron blocking layer is in a range from 0.15 to 0.30.

2. The photovoltaic device of claim 1, wherein the lattice mismatch between the electron blocking layer relative to the absorber layer is less than 2%.

3. The photovoltaic device of claim 1, wherein:
   a magnitude of a difference between x and the second surface of the absorber layer and y at the first surface of the electron blocking layer is less than 0.05.

4. The photovoltaic device of claim 3, wherein x is less than 0.3.

5. The photovoltaic device of claim 1, wherein the electron blocking layer has a mole ratio of $Cd_{(1-y)}Zn_{(y)}Te$, wherein y is in a range of 0.1 to 0.4.

6. The photovoltaic device of claim 1, wherein the absorber layer has a mole ratio of $CdTe_{(1-x)}Se_{(x)}$, wherein x is a range of 0.1 to 0.4.

7. The photovoltaic device of claim 1, further comprising a transition layer between the absorber layer and the electron blocking layer, wherein:
   the transition layer comprises a quaternary material having a mole ratio of $Cd_{(1-y)}Zn_{(y)}Te_{(1-x)}Se_{(x)}$;
   y is in a range between about 0.005 to about 0.4; and
   x is in a range between about 0.005 to about 0.4.

8. The photovoltaic device of claim 7, wherein a magnitude of the difference between x and y is less than 0.005 throughout the transition layer.

9. The photovoltaic device of claim 1, wherein the back contact comprises a zinc telluride layer, and wherein the back contact directly contacts the second surface of the electron blocking layer.

10. A photovoltaic device, comprising:
    an electron blocking layer formed from $Cd_{(1-y)}Zn_{(y)}Te$, wherein y is in a range between about 0.005 to about 0.4; and
    an absorber layer formed from $CdTe_{(1-x)}Se_{(x)}$, wherein x is in a range between about 0.005 to about 0.4; and
    wherein a lattice mismatch between the electron blocking layer relative to the absorber layer is less than 4%
    wherein:
    the absorber layer has a first surface and a second surface, wherein the second surface of the absorber layer is closer to a back contact than the first surface of the absorber layer;
    the electron blocking layer is between the absorber layer and the back contact;
    the electron blocking layer has a first surface and a second surface, wherein the second surface of the electron blocking layer is closer to the back contact than the first surface of the electron blocking layer;
    the absorber layer is compositionally graded and a value of x is greater at the first surface than at the second surface of the absorber layer; and
    the electron blocking layer is compositionally graded, and the value of y is greater at the second surface than at the first surface of the electron blocking layer, and wherein the value of y at the first surface of the electron blocking layer is in a range between 0.15 to 0.30.

11. The photovoltaic device of claim 10, wherein the composition of the electron blocking layer and the absorber layer is selected such that a magnitude of a difference between x and y, at an absorber interface between the absorber layer and the electron blocking layer, is less than 0.005, and wherein the lattice mismatch between the electron blocking layer relative to the absorber layer is less than or equal to 0.2%.

12. The photovoltaic device of claim 10, further comprising a transition layer between the absorber layer and the electron blocking layer, wherein the transition layer comprises a quaternary material having a mole ratio of $Cd_{(1-y)}Zn_{(y)}Te_{(1-x)}Se_{(x)}$.

13. The photovoltaic device of claim 10, further comprising a back contact disposed adjacent the electron blocking layer.

14. The photovoltaic device of claim 13, wherein the back contact comprises zinc telluride.

15. The photovoltaic device of claim 10, wherein a lattice mismatch between the electron blocking layer relative to the absorber layer is less than 2%.

16. A photovoltaic device, comprising:
   a front layer stack, wherein the front layer stack comprises a plurality of transparent layers;
   an absorber layer having a first surface disposed on the front layer stack and a second surface;
   an electron blocking layer having a first surface disposed over the second surface of the absorber layer and a second surface, the first surface of the electron blocking layer having a band gap that is at least 0.1 eV greater than a band gap of the second surface the absorber layer;
   a back contact layer disposed over the second surface of the electron blocking layer;
wherein:
   the electron blocking layer comprises a first polycrystalline material with a first plurality of grains having a zinc-blende structure, wherein the first polycrystalline material comprises cadmium, zinc, and tellurium;
   the absorber layer comprises a second polycrystalline material with a second plurality of grains having a zinc-blende structure, wherein the second polycrystalline material comprises cadmium, tellurium, and selenium; and
   a lattice mismatch between the electron blocking layer relative to the absorber layer is less than 4%; and
a transition layer between the absorber layer and the electron blocking layer, wherein:
   the transition layer comprises a quaternary material having a mole ratio of $Cd_{(1-y)}Zn_{(y)}Te_{(1-x)}Se_{(x)}$, where y is in a range between about 0.005 to about 0.4, and x is in a range between about 0.005 to about 0.4
wherein:
   the absorber layer is compositionally graded, whereby a concentration of selenium is greater at the first surface than at the second surface of the absorber layer;
   the electron blocking layer is compositionally graded, whereby a concentration of zinc is greater at the second surface than at the first surface of the electron blocking layer; and
   the electron blocking layer has a mole ratio of $Cd_{(1-y)}Zn_{(y)}Te$, where the value of y at the first surface of the electron blocking layer is in a range between 0.15 to 0.30.

* * * * *